(12) United States Patent
Lee et al.

(10) Patent No.: US 6,242,937 B1
(45) Date of Patent: Jun. 5, 2001

(54) HOT CARRIER MEASURING CIRCUIT

(75) Inventors: Hi Deok Lee, Cheongju; Dae Mann Kim, Pohang; Sang Gi Lee, Cheongju; Myoung Jun Jang, Wonju, all of (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/306,441

(22) Filed: May 6, 1999

(30) Foreign Application Priority Data

Feb. 12, 1999 (KR) .................................. 99-2027

(51) Int. Cl.⁷ .................................. G01R 31/26

(52) U.S. Cl. ...................... 324/769; 324/765; 324/768

(58) Field of Search ..................... 324/769, 765, 324/766, 768; 364/488, 576; 702/89, 117; 365/189.09; 716/5, 11, 17

(56) References Cited

U.S. PATENT DOCUMENTS

| | | | |
|---|---|---|---|
| 5,508,632 | * | 4/1996 | Shimizu et al. ...................... 324/769 |
| 5,600,578 | * | 2/1997 | Fang et al. ........................ 324/769 X |
| 5,805,508 | * | 9/1998 | Tobita .............................. 365/189.09 |
| 6,047,247 | * | 4/2000 | Iwanishi et al. ..................... 702/117 |
| 6,073,082 | * | 6/2000 | Maeda .............................. 324/769 X |

\* cited by examiner

*Primary Examiner*—Safet Metjahic
*Assistant Examiner*—T. R. Sundaram
(74) *Attorney, Agent, or Firm*—Fleshner & Kim, LLP

(57) ABSTRACT

A hot carrier measuring circuit of the present invention, which measures the characteristic degradation of a semiconductor device due to AC operation, includes a pulse generator generating at least two pulse signals which are partially overlapped with each other and have various duty ratios, a level shifter shifting the pulse signal which are generated in the pulse generator to a desired voltage level, and a measuring device receiving the pulse signals outputted from the level shifter to at least one terminal thereof.

18 Claims, 2 Drawing Sheets

HOT CARRIER MEASURING CIRCUIT

BACKGROUND OF THE INVENTION

1. Field of the Invention

The present invention relates to a semiconductor memory device, and more particularly to a hot carrier measuring circuit that measures characteristic deterioration of a semiconductor device.

2. Description of the Conventional Art

Electrons which are accelerated by an electric field of a channel collide with Si lattices and when the energy thereof exceeds a band-gap energy which is about 1.1V, thereby generating electron-hole pairs (impact ionization). Here, the generated hole is pulled to a silicon substrate side and thus observed as a substrate current, while the electron is pulled to a drain side and further pulled to an oxide film by an electric field which is organized by a gate voltage. Some electrons thereof which are seized by $SiO_2$ remain as electric charges, which results in change of the characteristic of a threshold voltage V of a transistor and thus the deterioration of the interface, thereby reducing conductance. Here, since such electrons have the energy which is considerably larger than the thermal equilibrium value, these are called hot carriers. FIG. 1 illustrates a conventional hot carrier measuring circuit. In the conventional hot carrier measuring circuit of FIG. 1, a plurality of inverters constitute a ring oscillator, each inverter being operated as a pulse generator. In such oscillator, an output from a first inverter is inputted to a second inverter and an output from the second inverter is inputted to a third inverter. Thus, an output of a (n−1)th inverter becomes an input of a nth inverter and an output of the nth inverter again becomes an input of the first inverter. Additionally, each inverter which serves as a pulse generator consists of a PMOS transistor and an NMOS transistor which are connected between a source voltage Vdd and a ground voltage Vss.

Accordingly, in the conventional art, the degradation of the NMOS and PMOS transistors is measured by separating drains 12, gates 13 and sources 14, 15 of the NMOS and PMOS transistors of a specific inverter from a pad of a bulk terminal and then performing the AC operation, that is operating the ring oscillator.

However, since the inverters, each serving as the pulse generator, have the same operation, it is impossible to individually analyze the effect according to rising time or falling time of a pulse signal. Further, the frequency of the ring oscillator is not varied in a uniform operational voltage.

SUMMARY OF THE INVENTION

Accordingly, the present invention is directed to a hot carrier measuring circuit which obviates the problems and disadvantages due to the conventional art.

An object of the present invention is to provide a hot carrier measuring circuit that analyzes the hot carrier characteristic of a device to be measured by generating pulse signals which have a desired frequency and various duty ratios in a silicon chip.

To achieve these and other advantages and in accordance with the purpose of the present invention, as embodied and broadly described, there is provided a hot carrier measuring circuit including a pulse generator which generates at least two pulse signals which are partially overlapped with each other and have various duty ratios, a level shifter which shifts the pulse signals generated in the pulse generator to a desirable voltage level and a measuring device having at least one terminal which receives the pulse signals outputted from the level shifter.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiment of the present invention, examples of which are illustrated in the accompanying drawings.

Figure 1:
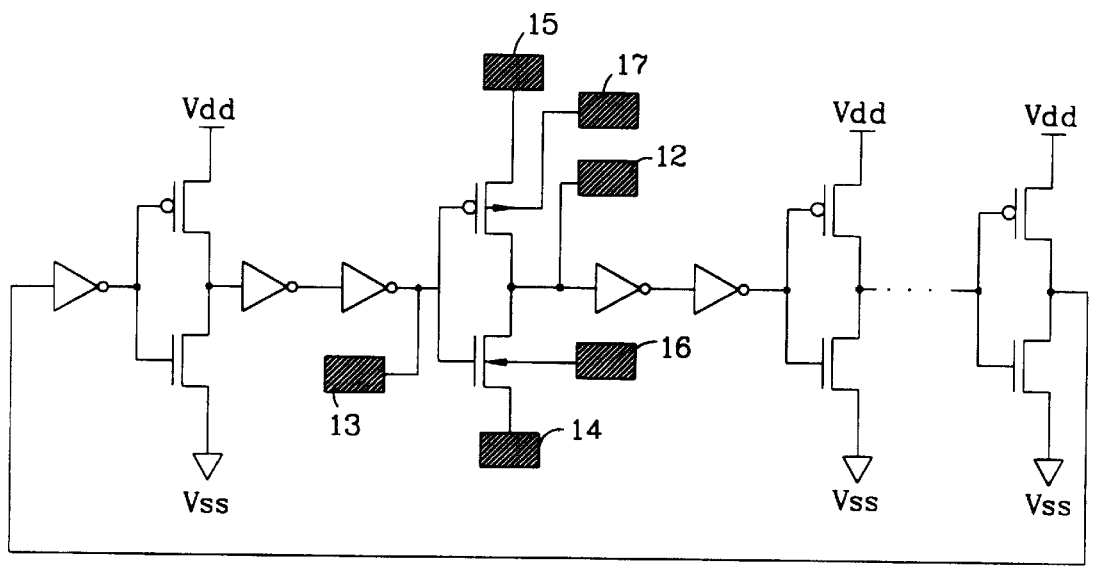
FIG. 1 is a diagram of a conventional hot carrier measuring circuit.
Figure 2:
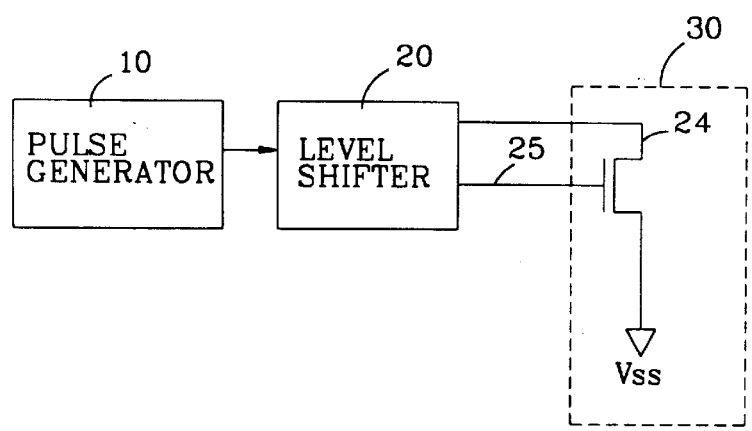
FIG. 2 is a schematic block diagram of a hot carrier measuring circuit according to the present invention.

FIG. 2 illustrates a hot carrier measuring circuit of the present invention which consists of a pulse generator 10 generating a plurality of pulse signals which have a desired frequency and various duty ratios, a level shifter 20 shifting the pulse signals generated in the pulse generator 10 to desired voltage levels and a measuring device 30. Here, it is noted that MOSFET (metal-oxide semiconductor field effect transistor), MESFET (metal semiconductor field effect transistor) or a bipolar transistor is used as the measuring device 30.

More specifically, the pulse signal generator 10 consists of a ring oscillator including at least three inverters and at least two NAND gates each of which NANDs outputs from the two different inverters in the ring oscillator, for thereby generating at least two pulse signals which are partially overlapped with each other and have various duty ratios. In addition, each inverter of the ring oscillator consists of a PMOS transistor and an NMOS transistor, and a source of each PMOS or NMOS transistor is connected with a load transistor which is controlled by a control voltage CV.

Figure 3:
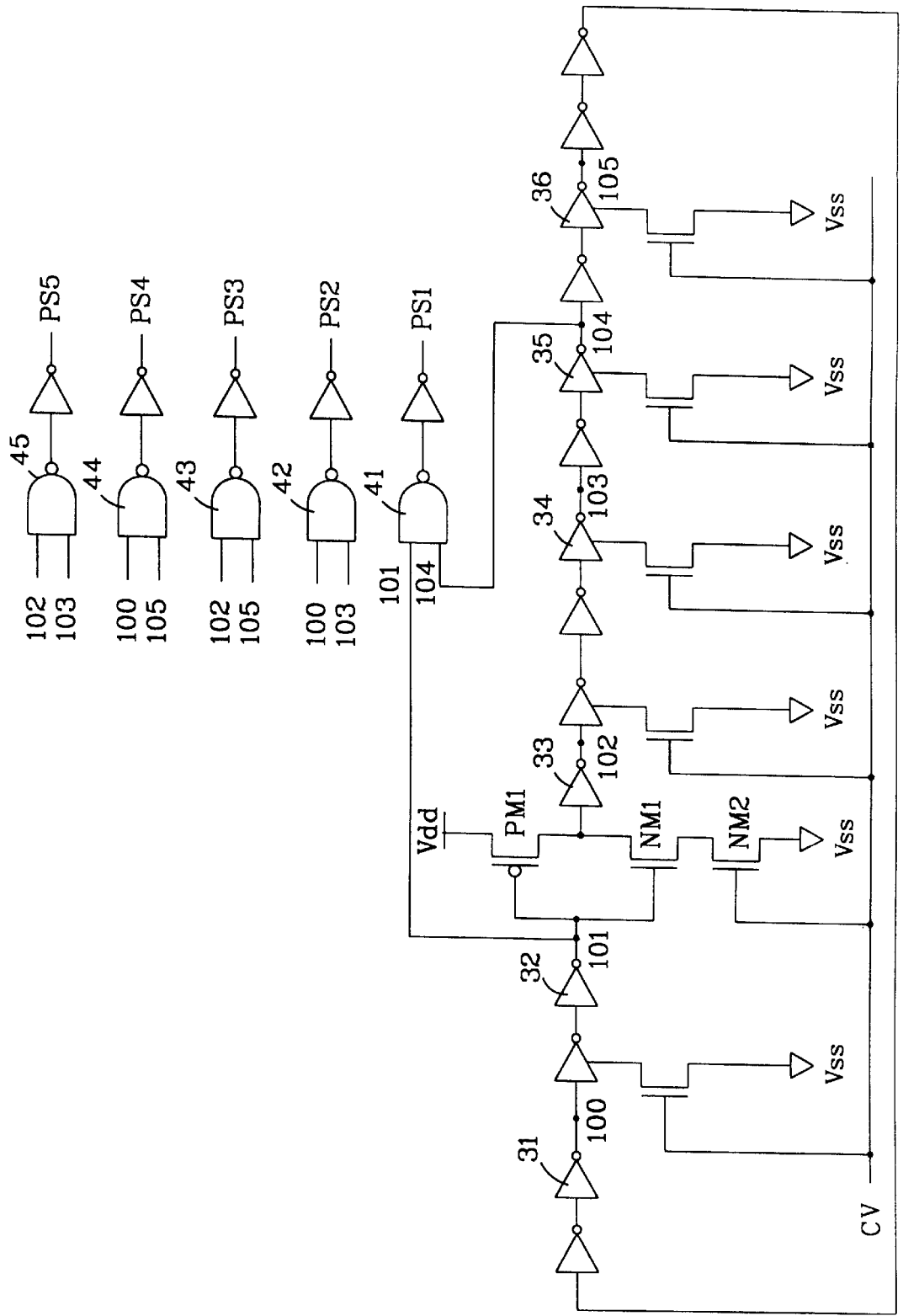
FIG. 3 is a detailed circuit diagram of a pulse generator in FIG. 2.

FIG. 3 illustrates a preferred embodiment of the pulse generator 10. As shown therein, each inverter of the ring oscillator consists of a PMOS transistor PM1 and an NMOS transistor NM1 wherein a frequency is varied in accordance with the control voltage CV applied to a gate of an NMOS transistor MN2 coupled so that a source of the NMOS transistor NM1 is connected with the NMOS transistor NM2. The NMOS transistor NM2 is also coupled to a ground voltage Vss. Further, in the preferred embodiment of the present invention, five NAND gates 41–45 generate five pulse signals PS1–PS5, and inverters respectively invert outputs from the corresponding NAND gates 41–45.

To achieve such configuration, a couple of inverters which are distanced from each other by at least four units and have an odd-numbered unit distance are selected and outputs thereof are inputted to the NAND gate 41. Then, outputs from the inverters which are both located at the front then and the rear of the selected inverters are inputted the NAND gates 42, 43, respectively, and outputs from inverters which are respectively located at the front and the rear of the originally selected inverters, respectively, and inverters which are at the rear and the front thereof, respectively, are inputted to the NAND gates 44, 45, respectively.

More specifically, referring to FIG. 3, outputs 101, 104 from selected inverters 32, 35 are inputted to the NAND gate 41. Outputs 100, 103 from inverters 31, 34 which respectively are located at the front of the inverters 32, 35 are inputted to the NAND gate 42, and outputs 102, 105 from inverters 33, 36 which are respectively located in the rear of the inverters 32, 35 are inputted to the NAND gate 43. While, outputs 100,105 from the inverters 31, 36 which are located at the front and the rear of the inverters 32, 35, respectively, are inputted to the NAND gate 44. Outputs 102, 103 from the inverters 33, 34 located at the front and the rear of the inverters 32, 35, respectively, are inputted to the NAND gate 45. Here, it is noted that each of the paired inverters has the odd-numbered unit distance. Accordingly, as can be seen in FIG. 3, the NAND gates 41–45 output five pulse signals PS1–PS5 through corresponding inverters by respectively NANDing the pair of outputs from each of the inverters 31–36 of the ring oscillator, while varying a frequency of the ring oscillator by changing the control voltage CV. The pulse signals PS1–PS5 are partially overlapped with each other and having various duty ratios.

Further, the pulse signals PS1–PS5 outputted from the pulse generator 10 are level-shifted in the level shifter 20. Accordingly, in the present invention the pulse signal PS1 is applied to at least one terminal of the measuring device 30, for example, to drain and gate terminals 24, 25 of the MOS transistor, as shown in FIG. 2, while the rest of the pulse signals PS2–PS5 are applied to terminals, except for the drain and gate terminals 24, 25, for thereby measuring the deterioration of the measuring device due to the AC operation. It is noted that in the present invention the pulse signals are not only applied to the gate and the drain, but also to a base or a collector of the bipolar transistor.

As described above, the hot carrier measuring circuit of the present invention measures the characteristic change of the device due to the rising time or falling time of the pulse signal by applying the plurality of pulse signals which are partially overlapped with each other and have various duty ratios in the silicon chip. This enables the systematic analysis of the hot carrier characteristic of the device in accordance with the AC signal due to the characteristic change of the device and thus has an effect of easily performing the reliability analysis of the device of which design rule is under $0.18\mu$.

It will be apparent to those skilled in the art that various modifications and variations can be made in the hot carrier measuring circuit of the present invention without departing from the spirit or scope of the invention. Thus, it is intended that the present invention cover the modifications and variations of this invention provided they come within the scope of the appended claims and their equivalents.

What is claimed is:

1. A hot carrier measuring circuit, comprising:
   a pulse generator generating at least two pulse signals which are partially overlapped with each other and have various duty ratios, wherein the pulse generator comprises:
   a ring oscillator comprising a plurality of inverters,
   a first logic gate receiving outputs from two of the inverters that are separated by a first prescribed unit distance to generate a first pulse signal of the at least two pulse signals, and
   a second logic gate receiving outputs from different ones of the inverters that are separated by a second prescribed unit distance to generate a second pulse signal of the at least two pulse signals;
   a level shifter shifting the pulse signals generated in the pulse generator to a desired voltage level; and
   a measuring device receiving the pulse signals outputted from the level shifter to at least one terminal thereof.

2. The hot carrier measuring circuit according to claim 1, wherein the measuring device is a MOSFET, a MESFET or a bipolar transistor.

3. The hot carrier measuring circuit according to claim 2, wherein the MOSFET is a p-type or an n-type.

4. The hot carrier measuring circuit according to claim 1, wherein an input terminal of the measuring device is a gate and a drain, a base or a collector.

5. The hot carrier measuring circuit according to claim 1, wherein the first and second logic gates are NAND gates, and wherein the first and second prescribed unit distances are odd-numbered unit distances.

6. The hot carrier measuring circuit according to claim 1, wherein each inverter of the ring oscillator comprises:
   a PMOS transistor and an NMOS transistor; and
   a load transistor connected between a source voltage and a source of the PMOS transistor or between a source of the NMOS transistor and a ground voltage and having a gate for receiving a control voltage.

7. The hot carrier measuring circuit according to claim 6, wherein the load transistor is a PMOS transistor or an NMOS transistor.

8. The hot carrier measuring circuit according to claim 1, wherein the first logic gate is a NAND gate that receives outputs from first and second inverters of the inverters that are distanced from each other by at least four units and have an odd-numbered unit distance, and wherein the pulse generator further comprises at least two additional NAND gates that receive outputs from inverters which are located at the front or the rear of the first and second inverters, respectively.

9. The hot carrier measuring circuit according to claim 8, wherein the at least two additional NAND gates receive outputs from two inverters which are respectively located at the front and the rear of the first and second inverters, respectively, or the two inverters which are at the rear and the front of the first and second inverters, respectively.

10. A circuit, comprising:
    a ring oscillator that has a plurality of series coupled inverters;
    a hot carrier measuring circuit connected to two of the inverters of the ring oscillator that generates at least two partially overlapped pulse signals that have various duty ratios;
    a level shifter that shifts the pulse signals generated in the hot carrier measuring circuit to respective desired voltage levels; and
    a measuring device that receives the pulse signals from the level shifter to at least one terminal thereof.

11. The circuit of claim 10, wherein the hot carrier measuring circuit comprises:
    a plurality of transistors, each coupled between a prescribed voltage level and a corresponding one of the plurality of inverters, wherein each of the plurality of transistors has a control electrode that receives a prescribed control signal.

12. The circuit of claim 10, wherein the hot carrier measuring circuit comprises:
    a pulse generator comprising:
    a first logic gate receiving outputs from a first pair of inverters that are separated by a first prescribed unit distance to generate a first pulse signal of the at least two pulse signals; and
    a second logic gate receiving outputs from a second pair of inverters that are separated by a second prescribed unit distance to generate a second pulse signal of the at least two pulse signals.

13. The circuit of claim 12, wherein each of the inverters comprises a PMOS transistor and an NMOS transistor coupled in series between a first prescribed voltage level and a second prescribed voltage level, and wherein the hot carrier measuring circuit comprises:

a plurality of transistors, wherein all of the transistors are connected between one of the first and second prescribed voltage levels and a corresponding one of the plurality of inverters, wherein each of the plurality of transistors has a control electrode that receives a prescribed control signal.

14. The circuit of claim 13, wherein the first and second logic gates are NAND gates, and wherein the first and second prescribed voltage levels are a source voltage level and a ground voltage level.

15. The circuit of claim 10, wherein the hot carrier measuring circuit comprises:

a first NAND gate that receives outputs from first and second inverters of the ring oscillator distanced from each other by an odd-numbered unit distance of at least four inverter units; and second through fourth NAND gates that receive outputs from two inverters located at the front or the rear of the first and second inverters, respectively.

16. The circuit of claim 10, wherein the second through fifth NAND gates receive outputs from two inverters that are both respectively located at the front of the first and second inverters, both respectively located at the rear of the first and second inverters, both respectively located at the rear and the front of the first and second inverters, and both respectively located at the front and the rear of the first and second inverters, respectively.

17. A measuring circuit, comprising:

a ring oscillator that has a plurality of series coupled inverters;

a hot carrier measuring circuit coupled to the ring oscillator that generates a plurality of overlapped pulse signals that have various duty ratios, wherein the hot carrier measuring circuit comprises, a first NAND gate that receives outputs from first and second inverters of the ring oscillator distanced from each other by an odd-numbered unit distance of at least four inverter units, second through fifth NAND gates that each receive outputs from two inverters that are both respectively located at the front of the first and second inverters, both respectively located at the rear of the first and second inverters, both respectively located at the rear and the front of the first and second inverters, and both respectively located at the front and the rear of the first and second inverters, respectively, a level shifter that shifts the pulse signals generated in the hot carrier measuring circuit to respective desired voltage levels, and a measuring device that receives the pulse signals from the level shifter to at least one terminal thereof.

18. The measuring circuit of claim 17, wherein the hot carrier measuring circuit comprises a plurality of transistors, each coupled between a prescribed voltage level and a corresponding one of the plurality of inverters, wherein each of the plurality of transistors has a control electrode that receives a prescribed control signal.

* * * * *

UNITED STATES PATENT AND TRADEMARK OFFICE
CERTIFICATE OF CORRECTION

PATENT NO.   : 6,242,937 B1
DATED        : June 5, 2001
INVENTOR(S)  : Hi Deok Lee, Dae Mann Kim, Sang Gi Lee and Myoung Jun Jang It is certified that error appears in the above-identified patent and that said Letters Patent is hereby corrected as shown below:

<u>Title page,</u>
Please correct the Item [30] Foreign Application Priority Data as follows:
change "99-2027" to -- 99-5027 --

Signed and Sealed this

Twenty-sixth Day of February, 2002

Attest:

Attesting Officer

JAMES E. ROGAN
*Director of the United States Patent and Trademark Office*